(12) United States Patent
Yamaguchi et al.

(10) Patent No.: US 7,166,828 B2
(45) Date of Patent: Jan. 23, 2007

(54) SOLID-STATE IMAGE SENSING DEVICE AND CELLPHONE HAVING IMAGE PROCESSING FUNCTION

(75) Inventors: Tetsuya Yamaguchi, Tokyo (JP); Hiroshige Goto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 11/087,602

(22) Filed: Mar. 24, 2005

(65) Prior Publication Data

US 2005/0218436 A1 Oct. 6, 2005

(30) Foreign Application Priority Data

Mar. 26, 2004 (JP) .............................. 2004-091497

(51) Int. Cl.
*H01L 31/062* (2006.01)
(52) U.S. Cl. ............................ 250/208.1; 250/214.1; 257/230; 257/292; 348/294; 348/311
(58) Field of Classification Search ............. 250/208.1, 250/214.1; 257/215, 226, 221–223, 230, 257/231, 291, 292; 348/294, 302, 304, 307, 348/308, 311
See application file for complete search history.

(56) References Cited

U.S. PATENT DOCUMENTS

| 6,521,925 | B1 * | 2/2003 | Mori et al. .................. 257/292 |
| 6,649,948 | B1 * | 11/2003 | Inoue .......................... 257/292 |
| 6,690,423 | B1 * | 2/2004 | Nakamura et al. .......... 348/311 |
| 7,030,433 | B1 * | 4/2006 | Mimuro et al. ............. 257/290 |

FOREIGN PATENT DOCUMENTS

| JP | 10-257394 | 9/1998 |
| JP | 11-074499 | 3/1999 |

* cited by examiner

*Primary Examiner*—Stephone B. Allen
(74) *Attorney, Agent, or Firm*—Oblon, Spivak, McClelland, Maier & Neustadt, P.C.

(57) ABSTRACT

A solid-state image sensing device including an image sensing region in which a matrix of unit pixels, each including a photodiode in a surface portion of a semiconductor substrate, is provided; a read transistor connected between a respective photodiode and a detection node; an amplifying transistor connected to the detection node so as to amplify the signal charge output to the detection node and to output a pixel signal to a signal output line reading out the pixel signal output; a reset transistor connected to the detection node and to a discharge node; and an address transistor connected to a source of the amplifying transistor for selecting an address of the photodiode when an address signal is supplied to a gate.

20 Claims, 6 Drawing Sheets

SOLID-STATE IMAGE SENSING DEVICE AND CELLPHONE HAVING IMAGE PROCESSING FUNCTION

CROSS REFERENCE TO RELATED APPLICATION

This application is based upon and claims benefit of priority under 35 USC § 119 from the Japanese Patent Application No. 2004-91497, filed on Mar. 26, 2004, the entire contents of which are incorporated herein by reference.

BACKGROUND OF THE INVENTION

The present invention relates to a solid-state image sensing device and a cellphone having an image processing function.

Generally, solid-state image sensing devices are roughly classified into a CCD sensor and CMOS sensor. The CMOS sensor in which signal charge is transferred by a signal line is superior in power consumption to the CCD sensor in which two types of pulses are applied to a transfer electrode to transfer signal charge in a semiconductor layer. The conventional CMOS sensor type solid-state image sensing device will be described below.

In the CMOS sensor type solid-state image sensing device, unit pixels are arranged in a matrix in an image sensing region. Each unit pixel includes a photoelectric converter (photodiode) which generates signal charge by photoelectric conversion, a read transistor which reads out this signal charge, a reset transistor which removes the signal charge, an amplifying transistor which amplifies the signal charge and outputs a pixel signal, and an address transistor which selects an address in which the photodiode is present.

The photodiode is formed by forming a P-well (P-type semiconductor region) in a semiconductor substrate, forming a resist film so as to cover a portion except for a prospective photodiode region, ion-implanting an impurity such as phosphorus by using the resist film as a mask, and annealing the resultant structure after the resist film is peeled.

Also, each of the reset transistor, amplifying transistor, selection transistor, and read transistor is formed by depositing a polysilicon film, and patterning this polysilicon film into a desired shape by, e.g., reactive ion etching (to be referred to as RIE hereinafter).

Unfortunately, the following problems arise as the micropatterning of elements advances, the number of pixels increases, and the level of functions rises.

(1) If the photodiode is irradiated with intense light and becomes unable to hold generated signal charge any more, this signal charge leaks into an adjacent photodiode. That is, a so-called blooming phenomenon cannot be prevented.

(2) When an electronic shutter function is added, the signal charge of the photodiode must be removed, i.e., a so-called reset operation must be performed. In the conventional device, this signal charge is removed via the reset transistor and read transistor. However, this method has the problem that it is difficult to control the operations of the reset transistor and read transistor present in a path when the signal charge is to be removed. Especially when the transistor operation control is complicated as the number of pixels increases, the operation margin of the whole device is adversely affected.

A method which solves the problem (1) described above is proposed in reference 1 (to be presented later). In this method, a photodiode is formed by ion-implanting phosphorus ($P^+$) a plurality of number of times, along the direction of depth of a semiconductor substrate.

Also, in reference 2 (to be presented later), the capacity by which a photodiode can store signal charge is increased by forming the photodiode in a deep position of a semiconductor substrate, thereby suppressing or reducing blooming.

Furthermore, the CCD sensor generally uses an N-type substrate as a semiconductor substrate, and signal charge overflowing from a photodiode is discarded to the substrate by applying a voltage of about 15 V to the substrate. That is, a so-called vertical overflow drain structure is proposed and put on the market.

Unfortunately, none of these methods can well suppress blooming, and can solve the problem pertaining to an electronic shutter described in (2) above.

The references disclosing the conventional solid-state image sensing devices are as follows.

Reference 1: Japanese Patent Laid-Open No. 11-74499
Reference 2: Japanese Patent Laid-Open No. 10-257394

SUMMARY OF THE INVENTION

According to one aspect of the present invention, there is provided a solid-state image sensing device comprising:

an image sensing region in which unit pixels are arranged in a matrix, each of the unit pixels comprising a photodiode formed in a surface portion of a first-conductivity-type semiconductor substrate, and including a second-conductivity-type first semiconductor layer which generates and stores signal charge by photoelectrically converting incident light, and a first-conductivity-type second semiconductor layer which is grounded, a read transistor which has a drain and source connected between the first semiconductor layer of the photodiode and a detection node, and, when a read signal is supplied to a gate, reads out the signal charge and outputs the readout signal charge to the detection node, an amplifying transistor which has a gate connected to the detection node, and a drain connected to a signal output line, and amplifies the signal charge output to the detection node to output a pixel signal to the signal output line, a reset transistor which has a second-conductivity-type third semiconductor layer connected to the detection node, and a second-conductivity-type fourth semiconductor layer connected to a discharge node, and, when a reset signal is supplied to a gate, removes signal charge present in the detection node to the opposite-polarity-type third semiconductor layer, and an address transistor which has a drain connected to a source of the amplifying transistor, and a source connected to a first voltage supply line, and selects an address of the photodiode when an address signal is supplied to a gate; and the signal output line which reads out the pixel signal output from the unit pixel by the amplifying transistor, wherein the first semiconductor layer is formed in a predetermined depth of the surface portion of the semiconductor substrate, the third semiconductor layer is formed in the surface portion of the semiconductor substrate, and at least a portion of the first semiconductor layer and at least a portion of the third semiconductor layer overlap each other, with a predetermined spacing therebetween, along a direction of depth of the semiconductor substrate.

According to one aspect of the present invention, there is provided a cellphone having an image processing function, comprising:

the solid-state image sensing device;

an image signal processor which performs image processing by receiving the pixel signal output from the solid-state image sensing device, and outputs an image signal;

an image display which displays an image by receiving the image signal; and a telephone module which generates a speech signal by receiving speech, transmits the speech signal to an outside after processing the speech signal, and processes an externally received signal to output the processed signal as speech.

DETAILED DESCRIPTION OF THE INVENTION

Embodiments of he present invention will be described below with reference to the accompanying drawings.

(1) First Embodiment

A solid-state image sensing device according to the first embodiment of the present invention will be described below.

Figure 1:
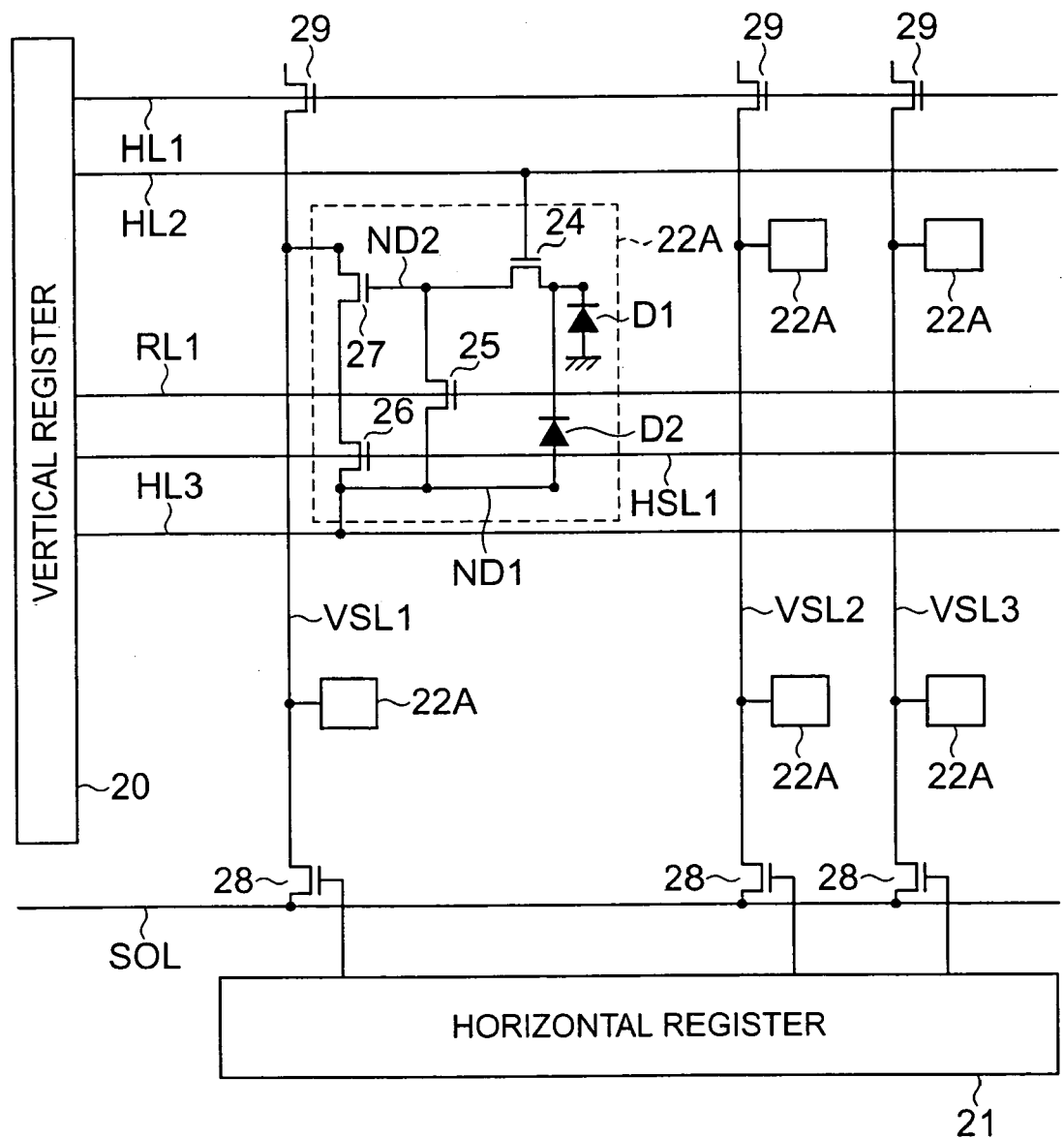
FIG. 1 is a circuit diagram showing the circuit configuration of a CMOS sensor type solid-state image sensing device according to the first embodiment of the present invention.

FIG. 1 shows the circuit configuration of the solid-state image sensing device according to this embodiment.

Unit pixels 22A are arranged in a matrix in an image sensing region of a semiconductor substrate. Each unit pixel 22A includes a photodiode D1, read transistor 24, reset transistor 25, address transistor 26, amplifying transistor 27, and diode D2. The diode D2 removes extra signal charge overflowing from the photodiode D1 in a normal operation mode. Also, before a signal charge storage period in an electronic shutter operation mode, the photodiode D2 temporarily removes signal charge stored in the photodiode D1 to a semiconductor layer (to be described below). In this embodiment, the semiconductor layer for holding signal charge also serves as a drain region of the reset transistor 25.

In the photodiode D1, the anode side of a P-type well is grounded, and the cathode side of an N-type semiconductor layer (to be described later) is connected to the source of the read transistor 24.

The cathode of the diode D2 is connected to the drain (N-type semiconductor layer) of the read transistor 24, and its anode is connected to a discharge node ND1 (P-type semiconductor layer) (to be described later).

The read transistor 24 has a gate connected to a read control line HL2, and a drain connected to the gate of the amplifying transistor 27 and to the source of the reset transistor 25 via a detection node ND2.

The amplifying transistor 27 has a drain is connected to one of vertical signal lines VSL1, VSL2, VSL3, . . . , and a source connected to the drain of the address transistor 26. Also, the reset transistor 25 has a gate connected to a reset control line RL1, and a drain connected to the discharge node ND1.

The address transistor 26 has a gate connected to a horizontal line select line HSL1, and a source connected to a voltage supply line HL3. The voltage supply line HL3 supplies a voltage of, e.g., 2.5 V, which is equivalent to the power supply voltage, in the normal operation mode, and supplies a pulsed voltage of, e.g., 5 V in the electronic shutter operation mode.

Referring to FIG. 1, in the upper portions of the vertical signal lines VSL1, VSL2, VSL3, . . . , the drains and sources of load transistors 29 are connected in series. In the lower portions of the vertical signal lines VSL1, VSL2, VSL3, . . . , the drains of horizontal line selection transistors 28 are connected. The sources of the horizontal line selection transistors 28 are connected to a signal output line SOL.

The gates of the load transistors 29 are connected to a load transistor driving line HL1. The gates of the horizontal line selection transistors 28 are connected to a horizontal register 21, and ON/OFF of these transistors is controlled by the horizontal register 21. Note that the load transistors 29 are normally ON while the device is in operation.

The load transistor driving line HL1, read control line HL2, reset control line RL1, horizontal line select line HSL1, voltage supply line HL3, and signal output line SOL are connected to and driven by a vertical register 20.

Figure 2:
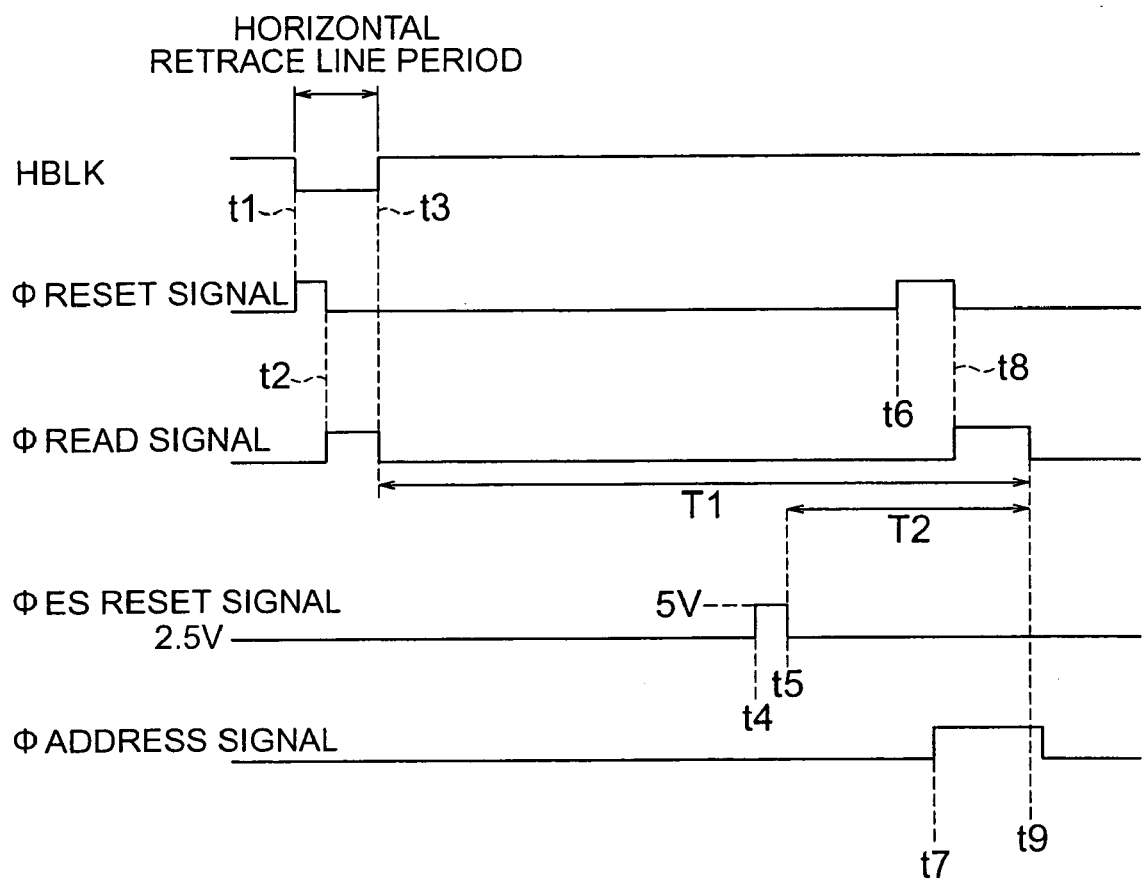
FIG. 2 is a timing chart showing the operation waveforms of control signals in the solid-state image sensing device.

In the normal operation mode, this solid-state image sensing device having the above configuration operates as follows. FIG. 2 is a timing chart showing changes in waveforms of driving voltages.

First, from time t1 to time t2 before a read operation is started, a high-level φ reset signal is input from the reset control line RL to the gate of the reset transistor 25 to turn it on, in order to remove extra signal charge stored in the detection node ND2 connected to the gate of the amplifying transistor 27. Consequently, this electric charge is removed as it flows to the voltage supply line HL3 via the transistor 25.

Then, from time t2 to time t3, a high-level φ read signal is supplied from the read control line HL2 to the gate of the read transistor 24 to turn it on, in order to remove signal charge present in the photodiode D1. This signal charge is stored in the detection node ND2 via the transistor 24.

A period from time t3 to time t9 is equivalent to a signal charge storage period T1.

Furthermore, from time t6 to time t8, a high-level φ reset signal is supplied to the reset transistor 25 to turn it on, in order to remove the extra signal charge stored in the detection node ND2. As a consequence, this signal charge is removed to the voltage supply line HL3.

To select an address in which the unit pixels 22A to be read are horizontally connected, one horizontal line select line HSL1 is raised by the vertical register 20. From time t7 to time t9, therefore, an φ address signal changes to high level, and the address transistor 26 whose gate has received this signal is turned on, thereby connecting the amplifying transistor 27 between the voltage supply line HL3 and one of the vertical signal lines VSL1, VSL2, VSL3, . . . .

From time t7 to time t9, a high-level φ read signal is supplied from the read control line HL2 to the gate of the read transistor 24 to turn it on in each of the unit pixels 22A connected to the selected horizontal line select line HSL1, in order from, e.g., the leftmost unit pixel 22A shown in FIG. 1.

Signal charge generated and stored in the photodiode D1 during the signal charge storage period T1 is supplied to the amplifying transistor 27 because the read transistor 24 is turned on. An electric current corresponding to the amount of stored signal charge flows through the amplifying transistor 27, and the load transistor 29 generates a voltage corresponding to the signal charge amount. This voltage appears as a pixel signal on each of the vertical signal lines VSL1, VSL2, VSL3, . . . . The horizontal register 21 sequentially turns on the horizontal line selection transistors 28 to sequentially connect the vertical signal lines VSL1, VSL2, VSL3, . . . , to the signal output line SOL, thereby sequentially reading out the pixel signals.

After all the voltages on the vertical signal lines VSL1, VSL2, VSL3, . . . , are read out, the next horizontal line select line HSL2 (not shown) is raised by the vertical register 20. The address transistor 26 is turned on, and the above operation is similarly performed. Consequently, pixel signals corresponding to signal charge read out from the unit pixels 22A connected to the horizontal line select line HSL2 are output.

If, in the signal charge storage period T1, high-luminance light is incident and the storage capacity of the N-type semiconductor layer of the photodiode D1 is exceeded, the extra signal charge is removed to the voltage supply line HL3 via the diode D2. This suppresses blooming.

An operation in the electronic shutter operation mode will be explained below.

As in the normal operation mode, before a read operation is started, a high-level φ reset signal is supplied to the gate of the reset transistor 25 to turn it on, in order to remove extra electric charge stored in the detection node ND2. This signal charge is removed as it flows to the voltage supply line HL3 via the transistor 25.

To remove signal charge present in the photodiode D1, the read transistor 24 is turned on, and this signal charge is stored in the detection node ND2 via the transistor 24.

In the normal operation mode, the process advances to the signal charge storage period after that. In the electronic shutter operation mode, however, an electronic shutter operation is performed before the process advances to this period. During a period from time t4 to time t5, the voltage of the voltage supply line HL3 is raised in the form of a pulse from a normal voltage of 2.5 V to 5 V. Consequently, the signal charge stored in the photodiode D1 is removed to the voltage supply line HL3 by the diode D2 to which a reverse bias is applied.

After that, the process advances to a signal charge storage period T2. However, the period T2 is shorter than the signal charge storage period T1 in the normal operation mode. A signal charge read operation after that is the same as in the normal operation mode, so a detailed description thereof will be omitted.

Figure 3:
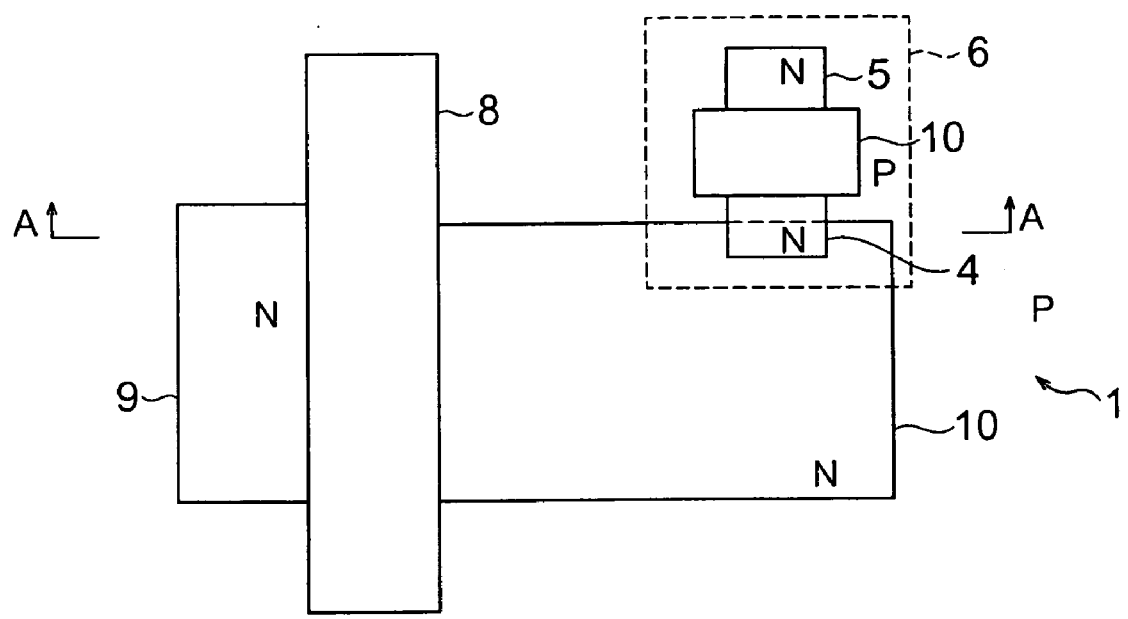
FIG. 3 is a plan view showing the planar structure of a photodiode and its vicinity in the solid-state image sensing device.
Figure 4:
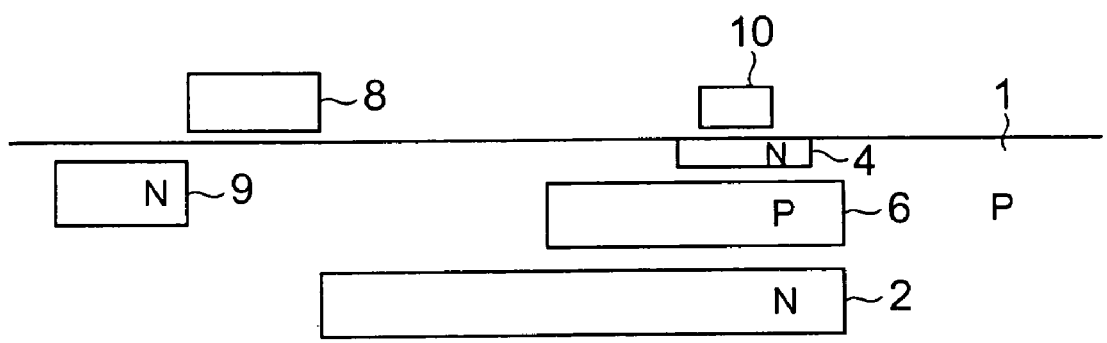
FIG. 4 is a sectional view showing a longitudinal sectional structure taken along a line A—A in FIG. 3.

FIG. 3 shows the photodiode and its vicinity in the solid-state image sensing device of this embodiment having the above circuit configuration. That is, FIG. 3 shows a planar structure including the P-well (anode) and N-type semiconductor layer (cathode) of the photodiode D1, the P-type semiconductor layer (anode) of the diode D2, the drain and source of the reset transistor 25, the gate of the read transistor 24, and the detection node ND2 connected to the gate of the amplifying transistor 27. FIG. 4 shows a longitudinal sectional structure taken along a line A—A in FIG. 3.

A P-well (P-type semiconductor region) 1 is formed in the surface portion of a P-type semiconductor substrate.

An N-type semiconductor layer 2 of the photodiode D1 is formed in a predetermined depth of the P-well 1. As shown in the plan view of FIG. 3, at least a portion of the N-type semiconductor layer 2 and at least a portion of a drain region (N-type semiconductor layer) 4 of the reset transistor 25 overlap each other along the direction of depth.

In addition, a P-type semiconductor layer 6, which corresponds to the anode of the diode D2, of the discharge node ND1 is formed intermediate, in the direction of depth, between the N-type semiconductor layer 2 and the drain region 4 of the reset transistor 25. The impurity concentration in the P-type semiconductor layer 6 is set higher than that in the P-well 1. The P-type semiconductor layer 6 like this is formed in order to prevent electrical connection between the N-type semiconductor layer 2 of the photodiode D1 and the drain region 4 of the reset transistor 25 while a voltage of, e.g., 2.5 V is not applied to the voltage supply line HL3.

A method of forming this solid-state image sensing device having the above arrangement will be explained below.

First, a P-well 1 is formed by doping a P-type impurity into the surface portion of a P-type semiconductor substrate.

An element isolation layer (not shown) is formed by using an insulating film formed by LOCOS or by using an STI (Shallow Trench Isolation) insulating layer; thereby isolating element regions in which elements such as a photodiode and transistors are to be formed.

As the element isolation method, it is also possible to use a channel stop method by which a P-type semiconductor layer is formed by implantation of $B^+$ (boron ions), instead of the LOCOS method or the STI formation method described above.

Then, in order to form an N-type semiconductor layer 2 of the photodiode D1 in the formed element region, a desired region is coated with a resist, and this resist is patterned to form a mask. By using this mask, $P^+$ (phosphorus ions) is ion-implanted at, e.g., an energy of 310 KeV and a dose of $1.2E12$ $cm^{-2}$ as the first ion implantation conditions.

After that, the resist film is removed by using an asher (oxygen radical) or a solution mixture of sulfuric acid and hydrogen peroxide.

A resist is formed by coating and patterned into a desired shape, and, e.g., $P^-$ ions are ion-implanted at an energy of 40 KeV and a dose of $1.3E13$ $cm^{-2}$, thereby forming a drain region (N-type semiconductor layer) 4 and source region (N-type semiconductor layer) 5.

As described above, the positional relationship, along the direction of depth, between the drain region (N-type semiconductor layer) 4 of the reset transistor 25 and the N-type semiconductor layer 2 of the photodiode D1 is such that at least a portion of the N-type semiconductor layer 2 and at least a portion of the drain region 4 overlap each other.

In addition, a P-type semiconductor layer 6 corresponding to the anode of the diode D2 is formed intermediate, in the direction of depth, between the N-type semiconductor layer 2 and drain region 4. The P-type semiconductor layer 6 can be formed by implanting, e.g., B+ ions at an energy of 80 KeV and a dose of 2E13 cm$^{-2}$. Since the P-type semiconductor layer 6 like this exists, the N-type semiconductor layer 2 and drain region 4 are electrically isolated from each other while a voltage of, e.g., 2.5 V is not applied to the voltage supply line HL3.

A gate oxide film having a film thickness of, e.g., 55 Å is formed on the semiconductor substrate, and a polysilicon film having a film thickness of, e.g., 3,000 Å is deposited by using CVD or the like.

After that, the polysilicon film is patterned into a desired gate electrode shape, thereby forming a gate electrode 10 of the reset transistor 25.

If the N-type semiconductor layer 2 and drain region 4 are well separated from each other in the direction of depth and are not electrically connected in the normal operation mode, the P-type semiconductor layer 6 need not be inserted between them. However, to prevent connection between a depletion layer of the N-type semiconductor layer 2 and a depletion layer formed by the drain region 6 of the reset transistor 25, it is effective and preferable to form the P-type semiconductor layer 6 between them.

When the above procedure is followed, at least a portion of the N-type semiconductor layer 2 of the photodiode D1 and at least a portion of the drain region 4 of the reset transistor 25 vertically overlap each other, along the direction of depth, via the P-type semiconductor layer 6.

In the normal operation mode, a predetermined voltage of, e.g., 2.5 V is always applied to the drain region 4 of the reset transistor 25 via the voltage supply line HL3. Accordingly, if intense light enters the N-type semiconductor layer 2 of the photodiode D1 to generate signal charge exceeding the capacity of the N-type semiconductor layer 2, this extra signal charge flows into the drain region 4 of the reset transistor 25 via the P-type semiconductor layer 6. Since the drain region 4 is connected to the voltage supply line HL3, the signal charge is removed. This suppresses blooming.

In the electronic shutter operation mode, a pulsed voltage of 5 V is applied to the voltage supply line HL3 before the signal charge storage period is started. Signal charge stored in the N-type semiconductor layer 2 of the photodiode D1 flows into the drain region 4 of the reset transistor 25 via the P-type semiconductor layer 6, and is removed to the voltage supply line HL3. In this manner, signal charge can be removed without passing it through the read transistor 24 or reset transistor 25, so an electronic shutter operation can be realized by simple control. This increases the operation margin of the whole device.

(2) Second Embodiment

A solid-state image sensing device according to the second embodiment of the present invention will be described below.

Figure 5:
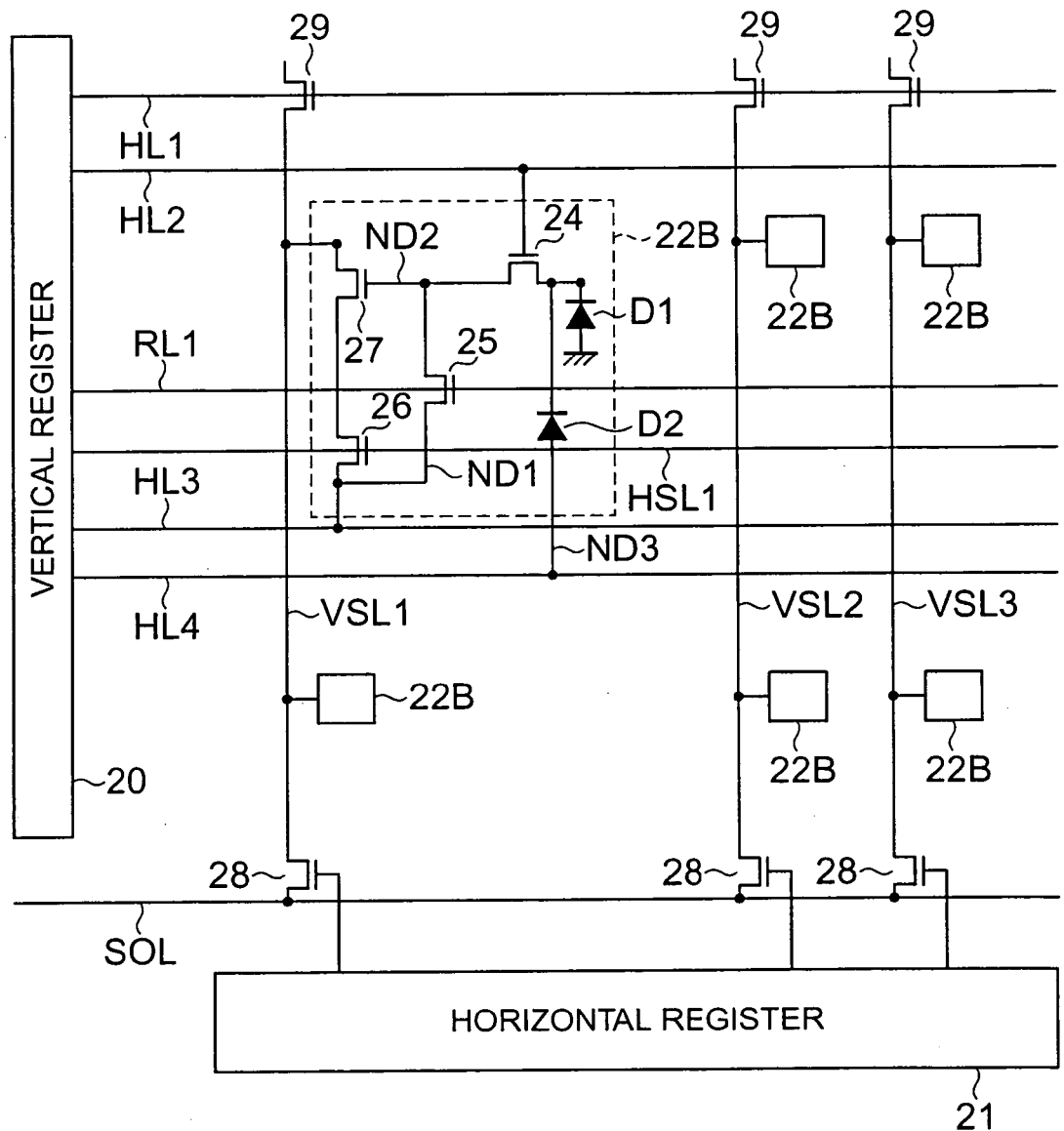
FIG. 5 is a circuit diagram showing the circuit configuration of a CMOS sensor type solid-state image sensing device according to the second embodiment of the present invention.

FIG. 5 shows the circuit configuration of the solid-state image sensing device according to this embodiment.

This embodiment differs from the first embodiment in that a voltage supply line HL4 which supplies a pulsed voltage of, e.g., 5 V for an electronic shutter operation only is formed in addition to a voltage supply line HL3 which supplies a predetermined voltage of, e.g., 2.5 V, and that the anode (P-type semiconductor layer 6) of a diode D2 is connected to the voltage supply line HL4.

A predetermined voltage of, e.g., 2.5 V is always applied to the voltage supply line HL3. On the other hand, a pulsed voltage of, e.g., 5 V is applied to the voltage supply line HL4 in an electronic shutter operation mode, and 0 V or a predetermined voltage of, e.g., 2.5 V is applied to the voltage supply line HL4 in other time periods.

A normal operation mode of the solid-state image sensing device according to this embodiment will be explained below with reference to FIG. 2 showing the waveforms of driving voltages as in the first embodiment.

First, from time t1 to time t2 before a read operation is started, a high-level φ reset signal is input from a reset control line RL to the gate of a reset transistor 25 to turn it on. Consequently, extra signal charge stored in a detection node ND2 connected to the gate of an amplifying transistor 27 is removed as it flows to the voltage supply line HL3 via the reset transistor 25.

Then, from time t2 to time t3, a high-level φ read signal is supplied from a read control line HL2 to the gate of a read transistor 24 to turn it on. Signal charge present in a photodiode D1 is removed and stored in the detection node ND2 via the read transistor 24.

A period from time t3 to time t9 is equivalent to a signal charge storage period T1.

Furthermore, from time t6 to time t8, a high-level φ reset signal is supplied to the reset transistor 25 to turn it on, in order to remove the extra signal charge stored in the detection node ND2. As a consequence, this signal charge is removed to the voltage supply line HL3.

To select the address in the horizontal direction of unit pixels 22A to be read, one horizontal line select line HSL1 is raised by a vertical register 20. From time t7 to time t9, therefore, an φ address signal changes to high level, and an address transistor 26 whose gate has received this signal is turned on, thereby connecting the amplifying transistor 27 between the voltage supply line HL3 and one of vertical signal lines VSL1, VSL2, VSL3, . . . .

From time t7 to time t9, a high-level φ read signal is supplied from the read control line HL2 to the gate of the read transistor 24 to turn it on in each of the unit pixels 22A connected to the selected horizontal line select line HSL1, in order from, e.g., the leftmost unit pixel 22A shown in FIG. 5.

Signal charge generated and stored in the photodiode D1 during the signal charge storage period T1 is supplied to the amplifying transistor 27 because the read transistor 24 is turned on. An electric current corresponding to the amount of stored signal charge flows through the amplifying transistor 27, and a load transistor 29 generates a voltage corresponding to the signal charge amount. This voltage flows through each of the vertical signal lines VSL1, VSL2, VSL3, . . . . A horizontal register 21 sequentially turns on horizontal line selection transistors 28 to sequentially connect the vertical signal lines VSL1, VSL2, VSL3, . . . , to a signal output line SOL, thereby reading out the voltages corresponding to the signal charge amounts.

After all the voltages on the vertical signal lines VSL1, VSL2, VSL3, . . . , are read out, the next horizontal line select line HSL2 (not shown) is raised by the vertical register 20. The address transistor 26 is turned on, and the above operation is similarly performed. Consequently, signal charge is read out from each unit pixel 22A connected to the horizontal line select line HSL2. If, in the signal charge storage period T1, high-luminance light is incident and the storage capacity of the N-type semiconductor layer of the photodiode D1 is exceeded, the extra signal charge is removed to the voltage supply line HL4 via the diode D2. This suppresses blooming.

The electronic shutter operation mode according to the second embodiment will be explained below.

As in the normal operation mode, before a read operation is started, a high-level φ reset signal is supplied to the gate of the reset transistor 25 to turn it on, in order to remove extra electric charge stored in the detection node ND2. This electric charge is removed as it flows to the voltage supply line HL3 via the transistor 25.

To remove signal charge present in the photodiode D1, the read transistor 24 is turned on, and this signal charge is stored in the detection node ND2 via the transistor 24.

In the normal operation mode, the process advances to the signal charge storage period after that. In the electronic shutter operation mode, however, an electronic shutter operation is performed before the process advances to this period. During a period from time t4 to time t5, the voltage of the voltage supply line HL4 formed exclusively for an electronic shutter independently of the voltage supply line HL3 is raised from 2.5 V to 5 V. Consequently, the signal charge stored in the photodiode D1 is removed to the voltage supply line HL4 by the diode D2 to which a reverse bias is applied.

After that, the process advances to a signal charge storage period T2. A signal charge read operation after that is the same as in the normal operation mode, so a detailed description thereof will be omitted.

Figure 6:
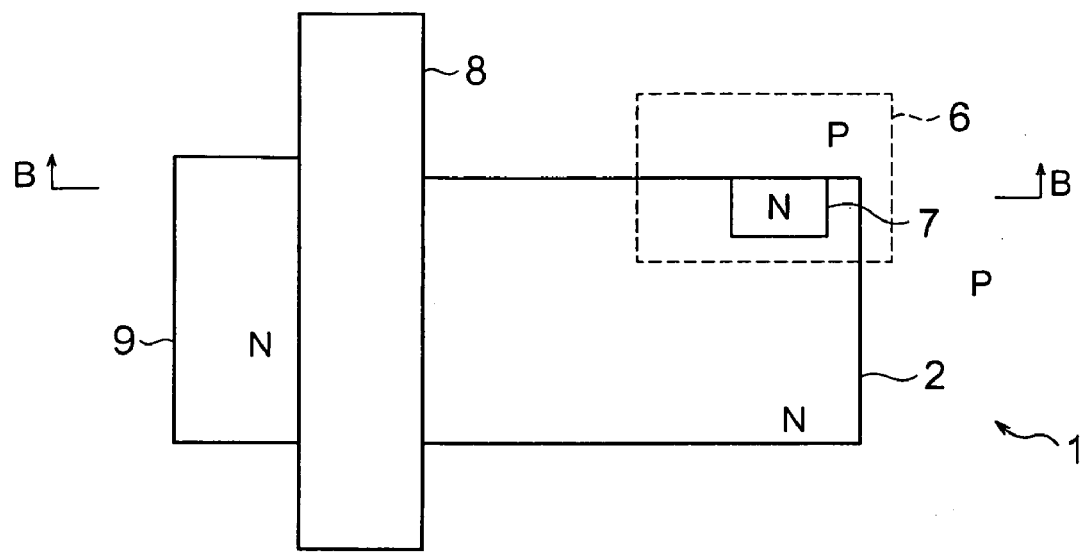
FIG. 6 is a plan view showing the planar structure of a photodiode and its vicinity in the solid-state image sensing device.
Figure 7:
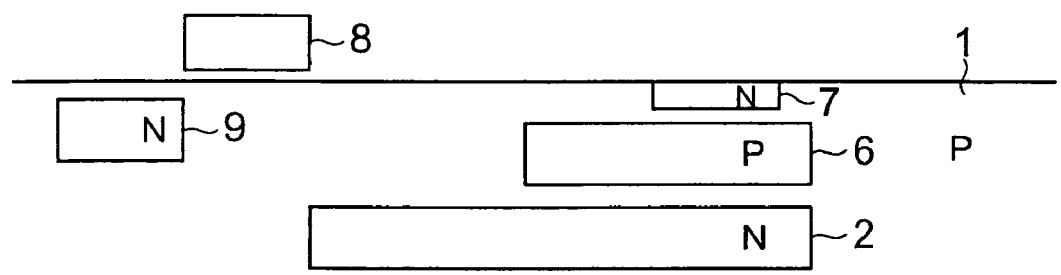
FIG. 7 is a sectional view showing a longitudinal sectional structure taken along a line B—B in FIG. 6.

FIG. 6 shows the photodiode and its vicinity in the solid-state image sensing device of this embodiment having the above circuit configuration. That is, FIG. 6 shows a planar structure including the P-well and N-type semiconductor layer of the photodiode D1, the P-type semiconductor layer corresponding to the anode of the diode D2, the gate of the read transistor 24, the detection node ND2, and a node ND3 (N-type semiconductor layer) to which the anode (P-type semiconductor layer) of the diode D2 is connected. FIG. 7 shows a longitudinal sectional structure taken along a line B—B in FIG. 6.

A P-well (P-type semiconductor region) 1 is formed in the surface portion of a P-type semiconductor substrate.

An N-type semiconductor layer 2 of the photodiode D1 is formed in a predetermined depth of the P-well 1. At least a portion of the N-type semiconductor layer 2 is positioned below an N-type semiconductor layer 7 corresponding to the node ND3 along the direction of depth.

In addition, a P-type semiconductor layer 6 corresponding to the anode of the diode D2 is formed intermediate, in the direction of depth, between the N-type semiconductor layer 7 and N-type semiconductor layer 2. The impurity concentration in the P-type semiconductor layer 6 is set higher than that in the P-well 1. Since the P-type semiconductor layer 6 like this is formed, it is possible to prevent electrical connection between the N-type semiconductor layer 2 of the photodiode D1 and the N-type semiconductor layer 7 of the node ND3 while a voltage of, e.g., 1.5 V is not applied to the voltage supply line HL4.

In this embodiment, if high-luminance light is incident and signal charge overflows from the N-type semiconductor layer of the photodiode D1, this signal charge is not absorbed by the drain region (N-type semiconductor layer 2) of the reset transistor 25 unlike in the first embodiment, but absorbed by the N-type semiconductor layer 7 (node ND3) which is formed exclusively to absorb and remove such signal charge, and to which a predetermined voltage of, e.g., 2.5 V is always applied in the normal operation mode. As a consequence, even when high-luminance light enters the photodiode D1 to cause signal charge to overflow, the N-type semiconductor layer 7 absorbs this signal charge, so blooming can be suppressed.

In the electronic shutter operation mode, before the signal charge storage period starts, the voltage supply line HL4 applies a pulsed voltage of 5 V to the N-type semiconductor layer 7 (node ND3). Therefore, signal charge stored in the photodiode D1 can be removed to the N-type semiconductor layer 7.

Accordingly, to remove extra signal charge stored in the photodiode, a pulsed voltage need only be applied to the N-type semiconductor layer 7 for removing signal charge, unlike in the conventional device in which this signal charge must be removed via, e.g., the read transistor or reset transistor. This makes it possible to simplify the reset operation control mechanism, and increase the operation margin of the whole device.

Also, the N-type semiconductor layer 7 for removing signal charge vertically overlaps, along the direction of depth, the N-type semiconductor layer 2 of the photodiode D1. Therefore, no new area is necessary to form the N-type semiconductor layer 7, and this contributes to downsizing.

Furthermore, in this embodiment, unlike in the first embodiment, a pulsed voltage of 5 V is applied to the voltage supply line HL4 formed exclusively for an electronic shutter operation. This makes it possible to always apply a voltage of 2.5 V to the voltage supply line HL3 in the electronic shutter operation mode as well as in the normal operation mode. Accordingly, the source of the reset transistor 25 and the source of the address transistor 26 are connected, so a predetermined voltage can always be applied, even in the electronic shutter operation mode, to the voltage supply line HL3 to which a predetermined voltage is to be applied. This ensures a stable circuit operation.

(3) Third Embodiment

Figure 8:
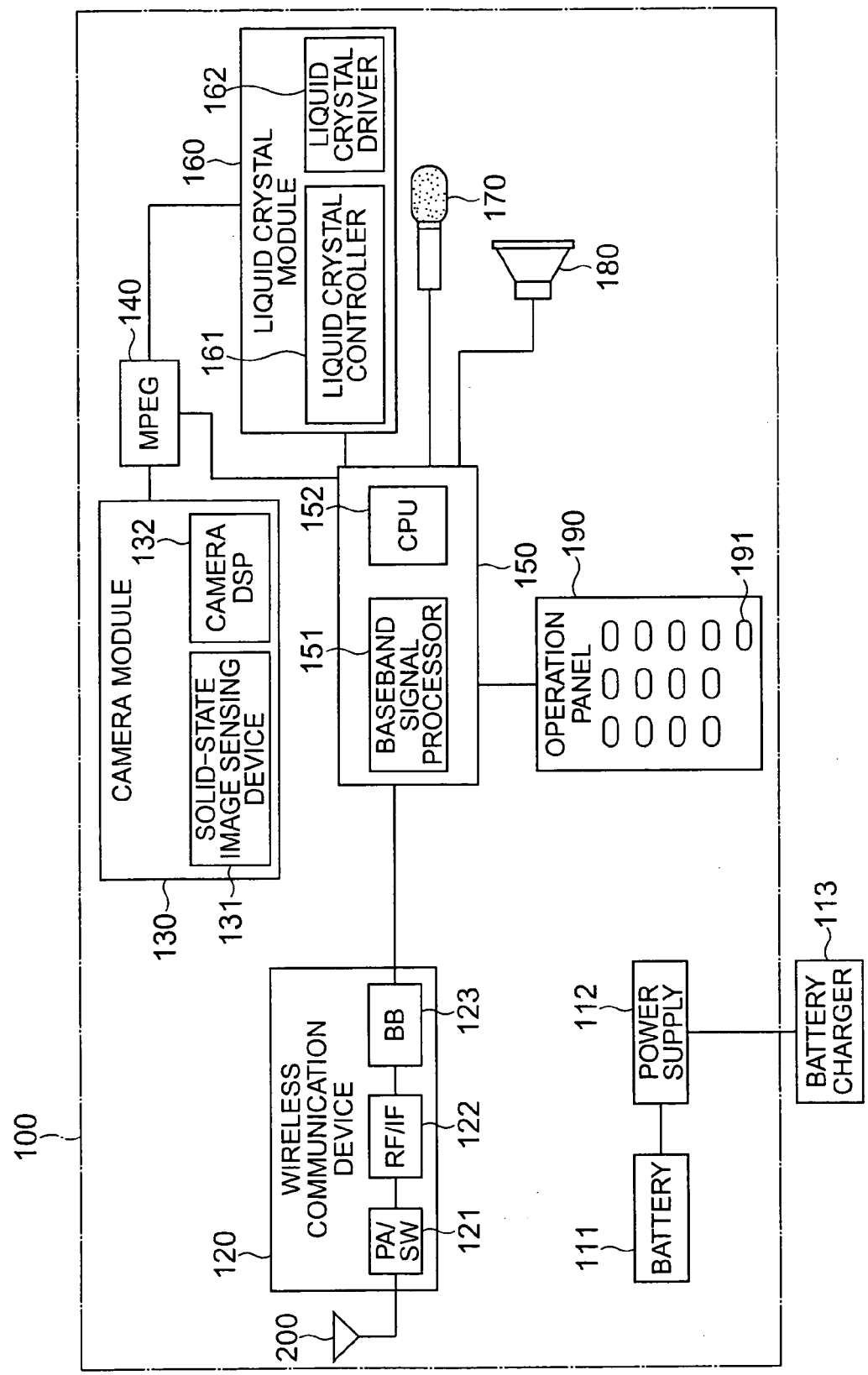
FIG. 8 is a block diagram showing the arrangement of a cellphone according to the third embodiment of the present invention.

A cellphone having an image processing function according to the third embodiment of the present invention will be described below with reference to FIG. 8 showing its arrangement.

A cellphone 100 has a battery 111, power supply 112, antenna 200, wireless communication device 120, camera module 130, MPEG software 140, signal processor 150, liquid crystal module 160, microphone 170, loudspeaker 180, and operation panel 190. The wireless communication device 120 includes a PA (Power Amplifier)/SW (Switch) 121, RF (Radio Frequency)/IF (Interface) 122, and BB (Base Band) 123. The camera module 130 includes a solid-state image sensing device 131 according to the first or second embodiment described above, and a camera DSP (Digital Signal Processor) 132 which corresponds to an image signal processor. The signal processor 150 includes a baseband signal processor 151 and CPU 152. The liquid crystal module 160 includes a liquid crystal controller 161 and liquid crystal driver 162, and functions as an image display. In addition, a battery charger 113 is prepared outside the cellphone 100.

The battery 111 charged by the battery charger 113 outputs a predetermined voltage. The power supply 112 to which this voltage is applied generates and supplies a power supply voltage which the cellphone 100 requires to operate.

The antenna 200 transmits and receives radio waves. In the wireless communication device 120, the PA (Power Amp.)/SW (Switch) 121 switches transmission and reception, and amplifies signals. The RF (Radio Frequency)/IF (Interface) 122 functions as an interface which processes radio-frequency signals. The BB (Base Band) 123 connects the cellphone 100 to a wireless LAN (Local Area Network) (not shown).

In the signal processor 150, the CPU 152 controls and manages the overall operation of the cellphone 100, and the baseband signal processor 151 processes speech signals and image signals.

Data input from the operation panel 190 by the operator is transmitted to the signal processor 150.

In the camera module 130, the solid-state image sensing device 131 has the arrangement according to the first or second embodiment described above. The solid-state image sensing device 131 generates and outputs an electrical signal by photoelectrically converting incident light. The camera. DSP (Digital Signal Processor) 132 is a control unit formed exclusively for image processing independently of the CPU 152. The camera DSP 132 performs image processing on the output electrical signal from the solid-state image sensing device 131, and outputs the obtained image signal. This image signal undergoes compression/expansion performed by the MPEG software 140.

The output image signal from the signal processor 150 is supplied to the liquid crystal module 160, and the image is displayed. In the liquid crystal module 160, the liquid crystal driver 162 drives a liquid crystal, and the liquid crystal controller 161 controls this liquid crystal driving.

Also, the output speech signal from the signal processor 150 is supplied to the loudspeaker 180, and the speech is output.

An input speech signal from the microphone 170 is supplied to the signal processor 150 and used in speech processing.

The operation panel 190 includes a switch 191 for switching ON and OFF of an electronic shutter operation, in addition to switches which ordinary cellphones have.

A telephone module including the signal processor 150, wireless communication device 120, antenna 200, microphone 170, loudspeaker 180, operation panel 190, and liquid crystal module 160 which displays information necessary for conversation is equivalent to a minimum necessary arrangement of a cellphone.

In the cellphone 100, the camera module 130 is formed using the solid-state image sensing device 131 according to the first or second embodiment. Therefore, an electronic shutter operation can be performed as described above, so the normal operation mode and electronic shutter operation mode must be switched.

When photographing is to be performed using the camera module 130 in a place where the luminance of light is high, the electronic shutter operation is turned on by using the switch 191 in order to suppress blooming. On the other hand, when photographing is to be performed in a place where the luminance is low, the electronic shutter operation is turned off and the normal operation mode is selected in order to obtain necessary sensitivity.

The cell phone 100 according to this embodiment uses the solid-state image sensing device 131 according to the first or second embodiment. This makes it possible to suppress blooming even in a normal operation, and realize the electronic shutter operation by a simple control operation. This increases the operation margin of the whole cellphone.

Each of the above embodiments is merely an example and does not limit the present invention. Therefore, these embodiments can be variously modified without departing from the technical scope of the invention. For example, the arrangement of the cellphone shown in FIG. 8 is merely an example, and the present invention is applicable to any apparatus using the solid-state image sensing device according to the invention.

The invention claimed is:

1. A solid-state image sensing device comprising:
an image sensing region in which unit pixels are arranged in a matrix, each of the unit pixels comprising
a photodiode formed in a surface portion of a first-conductivity-type semiconductor substrate, and including a second-conductivity-type first semiconductor layer which generates and stores signal charge by photoelectrically converting incident light, and a first-conductivity-type second semiconductor layer which is grounded,
a read transistor which has a drain and source connected between the first semiconductor layer of the photodiode and a detection node, and, when a read signal is supplied to a gate, reads out the signal charge and outputs the readout signal charge to the detection node,
an amplifying transistor which has a gate connected to the detection node, and a drain connected to a signal output line, and amplifies the signal charge output to the detection node to output a pixel signal to the signal output line,
a reset transistor which has a second-conductivity-type third semiconductor layer connected to the detection node, and a second-conductivity-type fourth semiconductor layer connected to a discharge node, and, when a reset signal is supplied to a gate, removes signal charge present in the detection node to the second-conductivity-type third semiconductor layer, and
an address transistor which has a drain connected to a source of the amplifying transistor, and a source connected to a first voltage supply line, and selects an address of the photodiode when an address signal is supplied to a gate; and
the signal output line which reads out the pixel signal output from the unit pixel by the amplifying transistor,
wherein the first semiconductor layer is formed in a predetermined depth of the surface portion of the semiconductor substrate,
the third semiconductor layer is formed in the surface portion of the semiconductor substrate, and
at least a portion of the first semiconductor layer and at least a portion of the third semiconductor layer overlap each other, with a predetermined spacing therebetween, along a direction of depth of the semiconductor substrate.

2. A device according to claim 1, wherein the third semiconductor layer also functions as a drain region of the reset transistor.

3. A device according to claim 1, further comprising a first-conductivity-type fifth semiconductor layer formed, in the surface portion of the semiconductor substrate, between the first and third semiconductor layers along the direction of depth of the semiconductor substrate, and connected to the discharge node.

4. A device according to claim 2, further comprising a first-conductivity-type fifth semiconductor layer formed, in the surface portion of the semiconductor substrate, between the first and third semiconductor layers along the direction of depth of the semiconductor substrate, and connected to the discharge node.

5. A device according to claim 3, wherein the fifth semiconductor layer is connected to the first semiconductor layer to form a diode.

6. A device according to claim 4, wherein the fifth semiconductor layer is connected to the first semiconductor layer to form a diode.

7. A device according to claim 1, wherein the discharge node is connected to the first voltage supply line.

8. A device according to claim 3, wherein the discharge node is connected to the first voltage supply line.

9. A device according to claim 1, further comprising a second voltage supply line which applies a predetermined voltage to the discharge node in a normal operation mode, and applies a pulsed voltage higher than the predetermined voltage to the discharge node in an electronic shutter operation mode.

10. A device according to claim 3, further comprising a second voltage supply line which applies a predetermined voltage to the discharge node in a normal operation mode, and applies a pulsed voltage higher than the predetermined voltage to the discharge node in an electronic shutter operation mode.

11. A cellphone having an image processing function, comprising:

the solid-state image sensing device comprising, an image sensing region in which unit pixels are arranged in a matrix, each of the unit pixels having, a photodiode formed in a surface portion of a first-conductivity-type semiconductor substrate, and including a second-conductivity-type first semiconductor layer which generates and stores signal charge by photoelectrically converting incident light, and a first-conductivity-type second semiconductor layer which is grounded, a read transistor which has a drain and source connected between the first semiconductor layer of the photodiode and a detection node, and, when a read signal is supplied to a gate, reads out the signal charge and outputs the readout signal charge to the detection node, an amplifying transistor which has a gate connected to the detection node, and a drain connected to a signal output line, and amplifies the signal charge output to the detection node to output a pixel signal to the signal output line, a reset transistor which has a second-conductivity-type third semiconductor layer connected to the detection node, and a second-conductivity-type fourth semiconductor layer connected to a discharge node, and, when a reset signal is supplied to a gate, removes signal charge present in the detection node to the second-conductivity-type third semiconductor layer, and an address transistor which has a drain connected to a source of the amplifying transistor, and a source connected to a first voltage supply line, and selects an address of the photodiode when an address signal is supplied to a gate; and the signal output line which reads out the pixel signal output from the unit pixel by the amplifying transistor, wherein the first semiconductor layer is formed in a predetermined depth of the surface portion of the semiconductor substrate, the third semiconductor layer is formed in the surface portion of the semiconductor substrate, and at least a portion of the first semiconductor layer and at least a portion of the third semiconductor layer overlap each other, with a predetermined spacing therebetween, along a direction of depth of the semiconductor substrate;

an image signal processor which performs image processing by receiving the pixel signal output from the solid-state image sensing device, and outputs an image signal;

an image display which displays an image by receiving the image signal; and a telephone module which generates a speech signal by receiving speech, transmits the speech signal to an outside after processing the speech signal, and processes an externally received signal to output the processed signal as speech.

12. A cellphone according to claim 11, wherein the third semiconductor layer of the solid-state image sensing device also functions as a drain region of the reset transistor.

13. A cellphone according to claim 11, further the solid-state image sensing device comprising a first-conductivity-type fifth semiconductor layer formed, in the surface portion of the semiconductor substrate, between the first and third semiconductor layers along the direction of depth of the semiconductor substrate, and connected to the discharge node.

14. A cellphone according to claim 12, further the solid-state image sensing device comprising a first-conductivity-type fifth semiconductor layer formed, in the surface portion of the semiconductor substrate, between the first and third semiconductor layers along the direction of depth of the semiconductor substrate, and connected to the discharge node.

15. A cellphone according to claim 13, wherein the fifth semiconductor layer of the solid-state image sensing device is connected to the first semiconductor layer to form a diode.

16. A cellphone according to claim 14, wherein the fifth semiconductor layer of the solid-state image sensing device is connected to the first semiconductor layer to form a diode.

17. A cellphone according to claim 11, wherein the discharge node of the solid-state image sensing device is connected to the first voltage supply line.

18. A cellphone according to claim 13, wherein the discharge node of the solid-state image sensing device is connected to the first voltage supply line.

19. A cellphone according to claim 11, the solid-state image sensing device further comprising a second voltage supply line which applies a predetermined voltage to the discharge node in a normal operation mode, and applies a pulsed voltage higher than the predetermined voltage to the discharge node in an electronic shutter operation mode.

20. A cellphone according to claim 13, the solid-state image sensing device further comprising a second voltage supply line which applies a predetermined voltage to the discharge node in a normal operation mode, and applies a pulsed voltage higher than the predetermined voltage to the discharge node in an electronic shutter operation mode.

* * * * *